(12) United States Patent
Sung et al.

(10) Patent No.: US 7,804,352 B2
(45) Date of Patent: Sep. 28, 2010

(54) MULTI-LEVEL ANTI-FUSE AND METHODS OF OPERATING AND FABRICATING THE SAME

(75) Inventors: Junghun Sung, Yongin-si (KR); Sangmoo Choi, Yongin-si (KR); Deokkee Kim, Yongin-si (KR); Soojung Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/385,223

(22) Filed: Apr. 2, 2009

(65) Prior Publication Data

US 2009/0251201 A1 Oct. 8, 2009

(30) Foreign Application Priority Data

Apr. 2, 2008 (KR) .................. 10-2008-0030859

(51) Int. Cl.
*H01H 37/76* (2006.01)
*H01H 85/00* (2006.01)

(52) U.S. Cl. ..................................... 327/525

(58) Field of Classification Search ......... 327/525–526; 365/225.7
See application file for complete search history.

(56) References Cited

U.S. PATENT DOCUMENTS

| 5,886,392 | A * | 3/1999 | Schuegraf ............ 257/530 |
| 6,788,607 | B2 * | 9/2004 | Duval et al. .......... 365/225.7 |
| 7,567,114 | B2 * | 7/2009 | Matsubara ........... 327/525 |
| 2002/0175741 | A1 * | 11/2002 | Sher ..................... 327/525 |
| 2003/0198109 | A1 * | 10/2003 | Sakoh ................... 365/200 |
| 2004/0217441 | A1 * | 11/2004 | Lehmann et al. ...... 257/530 |

* cited by examiner

*Primary Examiner*—Quan Tra
(74) *Attorney, Agent, or Firm*—Harness, Dickey & Pierce, P.L.C.

(57) ABSTRACT

Provided may be a multi-level anti-fuse and methods of fabricating and operating the same. The multi-level anti-fuse may include at least three anti-fuses having a plurality of anti-fuses connected in parallel constituting a parallel connection structure and at least one anti-fuse connected to the parallel connection structure in series, wherein the parallel connection structure may have a smaller resistance than the resistance of the anti-fuse connected in series, the plurality of anti-fuses connected in parallel may include dielectric layers having different thicknesses from one another, and the breakdown voltages of each dielectric layer may be different from one another.

20 Claims, 4 Drawing Sheets

MULTI-LEVEL ANTI-FUSE AND METHODS OF OPERATING AND FABRICATING THE SAME

PRIORITY STATEMENT

This application claims priority under 35 U.S.C. §119 to Korean Patent Application No. 10-2008-0030859, filed on Apr. 2, 2008, in the Korean Intellectual Property Office (KIPO), the entire contents of which are incorporated herein by reference.

BACKGROUND

1. Field

Example embodiments relate to an anti-fuse and methods of operating and fabricating the same, and more particularly, to a multi-level anti-fuse that may perform a multi-level program operation and methods of operating and fabricating the same.

2. Description of the Related Art

Anti-fuses may have electrical characteristics opposite to those of fuses. For example, anti-fuses, which are generally fuse devices having resistive properties, may have a higher resistance when not initially programmed, and thus, current does not flow through. On the other hand, anti-fuses may have a lower resistance when a program operation proceeds.

These anti-fuses may be used for the repair of defective cells, the storage of chip identification (ID), and circuit customization, in semiconductor devices, e.g., semiconductor memory or logic devices. For example, cells determined to be a defective cell in a plurality of cells of a memory device may be replaced with redundancy cells by anti-fuses. Thus, a yield reduction caused by the defective cells may be overcome.

An anti-fuse may have a structure in which a dielectric may be sandwiched between two conductors, for example, a capacitor structure. An anti-fuse program operation may be performed such that a high voltage may be applied to the anti-fuse, thereby causing breakdown of the dielectric between the two conductors, which results in a short circuit of the two conductors.

Thus, in semiconductor devices using anti-fuses, a voltage may be applied to both ends of the anti-fuses to induce the breakdown of the dielectric, which may be detected by a sensing amplifier. In such a structure employing anti-fuses, in general, a single anti-fuse requires a single sensing amplifier, and thus, decreasing the size of a circuit of the anti-fuses may be difficult, thereby limiting a decrease in total chip size.

SUMMARY

Example embodiments provide a multi-level anti-fuse which may operate a multi-level program and in which a total chip size may be decreased by reducing the number of sensing means per anti-fuse, and methods of operating and fabricating the same.

According to example embodiments, a multi-level anti-fuse may include at least three anti-fuses including a plurality of anti-fuses connected in parallel constituting a parallel connection structure, and at least one anti-fuse connected to the parallel connection structure in series, wherein the parallel connection structure may have a smaller resistance than the resistance of the anti-fuse connected in series, the plurality of anti-fuses connected in parallel may include dielectric layers having different thicknesses from one another, and the breakdown voltages of each dielectric layer may be different from one another.

A dielectric layer of at least one of the plurality of anti-fuses connected in parallel may have a first thickness that is thinner than a second thickness of a dielectric layer of the anti-fuse connected in series, and the anti-fuse including the dielectric layer having the first thickness may have a lower breakdown voltage than the breakdown voltage of the anti-fuse including the dielectric layer having the second thickness.

The thickness of the dielectric layer of the other anti-fuse of the plurality of anti-fuses that may be connected in parallel may be larger than the first thickness and be different from the second thickness. Each of the plurality of anti-fuses connected in parallel and the at least one anti-fuse connected in series to the plurality of anti-fuses connected in parallel may include a dielectric layer on a substrate and a gate electrode on the dielectric layer.

The at least three anti-fuses may include a first anti-fuse including a dielectric layer having a first thickness and a first gate electrode formed on the dielectric layer; a second anti-fuse including a dielectric layer having a second thickness and a second gate electrode formed on the dielectric layer; and a third anti-fuse including a dielectric layer having a third thickness and a third gate electrode on the dielectric layer, wherein the first thickness may be smaller than the second and third thicknesses, the first and third anti-fuses may be connected in parallel, and the second anti-fuse may be connected to the parallel connection structure in series.

The third thickness may be larger or smaller than the second thickness. The dielectric layer may be a layer formed of a material that may have breakdown properties when a voltage greater than a critical voltage may be applied. The dielectric layer may be an oxide layer that may have a breakdown when a voltage greater than a critical voltage may be applied.

According to example embodiments, a method of operating the multi-level anti-fuse may include providing at least three anti-fuses including a plurality of anti-fuses connected in parallel constituting a parallel connection structure, and at least one anti-fuse connected to the parallel connection structure in series, wherein the parallel connection structure has a smaller resistance than the resistance of the anti-fuse connected in series, and the plurality of anti-fuses connected in parallel have dielectric layers having different thicknesses from one another, and the breakdown voltages of each dielectric layer are different from one another, sensing the multi-level anti-fuse in a section before a breakdown of the anti-fuse connected to the parallel connection structure in series by applying a first voltage to the multi-level anti-fuse, causing the anti-fuse connected to the parallel connection structure in series to have a breakdown, sensing the multi-level anti-fuse by applying a second voltage to the multi-level anti-fuse in a state where a breakdown of the anti-fuse connected to the parallel connection structure in series occurs to cause the soft breakdown of the anti-fuse having the smallest breakdown voltage from among the plurality of anti-fuses of the parallel connection structure, resulting in a rise in the leakage current, and sensing the multi-level anti-fuse by applying a third voltage to the multi-level anti-fuse to cause the hard breakdown of the anti-fuse having the smallest breakdown voltage from among the plurality of anti-fuses of the parallel connection structure and cause the soft breakdown of the anti-fuse having the second smallest breakdown voltage from among the plurality of anti-fuses of the parallel connection structure, resulting in a second rising of a leakage current.

According to example embodiments, a method of fabricating a multi-level anti-fuse may include connecting at least three anti-fuses including a plurality of anti-fuses in parallel to constitute a parallel connection structure, and connecting at least one anti-fuse to the parallel connection structure in series, wherein the parallel connection structure has a smaller resistance than the resistance of the anti-fuse connected in series, and the plurality of anti-fuses connected in parallel include dielectric layers having different thicknesses from one another, and the breakdown voltages of each dielectric layer are different from one another.

BRIEF DESCRIPTION OF THE DRAWINGS

Example embodiments will be more clearly understood from the following detailed description taken in conjunction with the accompanying drawings. FIG. 1 is a graph showing a change in breakdown voltage characteristics according to the thickness of an oxide layer;

FIG. 2 is a diagram illustrating an equivalent circuit of the structure of a multi-level anti-fuse according to example embodiments;

FIG. 3 is a conceptual diagram of the structure of the multi-level anti-fuse of FIG. 2;

FIG. 4 is a diagram illustrating an operation of a multi-level anti-fuse according to example embodiments; and FIG. 5 is a graph showing a bias section for the operation of the multi-level anti-fuse of FIG. 4.

Figure 1:
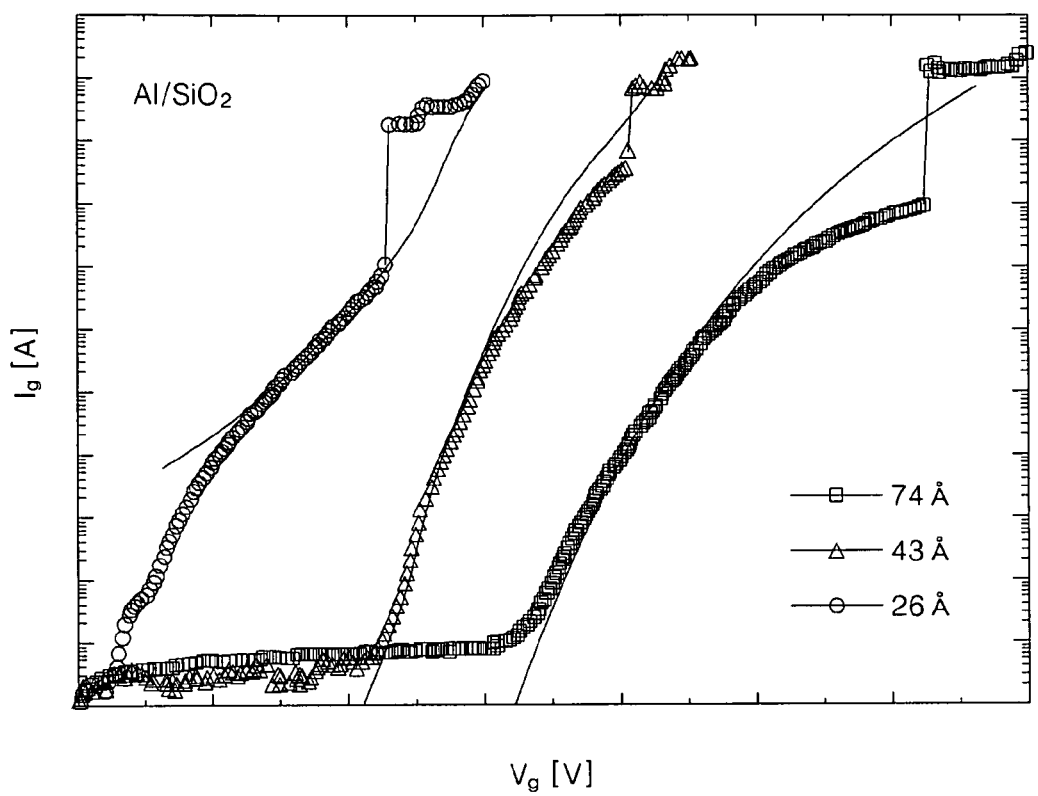
FIGS. 1-5 represent non-limiting, example embodiments as described herein

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will be described more fully hereinafter with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a graph showing a change in breakdown voltage characteristics according to the thickness of an oxide layer. In FIG. 1, the changes in current-voltage characteristics may be for metal-oxide-silicon (MOS)-capacitor structures which may be each formed such that a silicon oxide (SiO$_2$) layer may be formed on a p-type silicon layer, and an aluminum layer may be formed on the silicon oxide layer, and the thicknesses of the silicon oxide layers may be about 74 Å, about 43 Å, and about 26 Å, respectively.

As illustrated in FIG. 1, a capacitor structure including the silicon oxide layer having a thickness of about 26 Å may have a lower breakdown voltage (low $V_{bd}$) and faster soft breakdown characteristics. On the other hand, a capacitor structure including the silicon oxide layer having a thickness of about 74 Å may have a higher breakdown voltage (high $V_{bd}$) and slower soft breakdown characteristics.

Thus, a multi-level anti-fuse may be embodied by forming anti-fuses in parallel and in series based on such characteristics described above. In addition, a single sensing unit, for example, a sensing amplifier, may be applied to the multi-level anti-fuse, and thus, a single sensing unit may be applied to a plurality of anti-fuses. Accordingly, the size of an anti-fuse circuit may be decreased.

Figure 2:
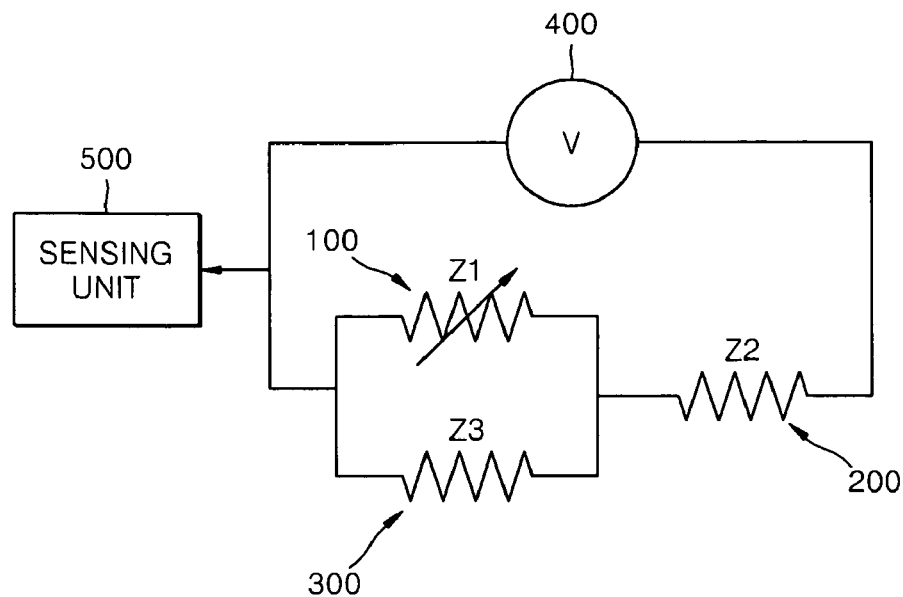
Figure 3:
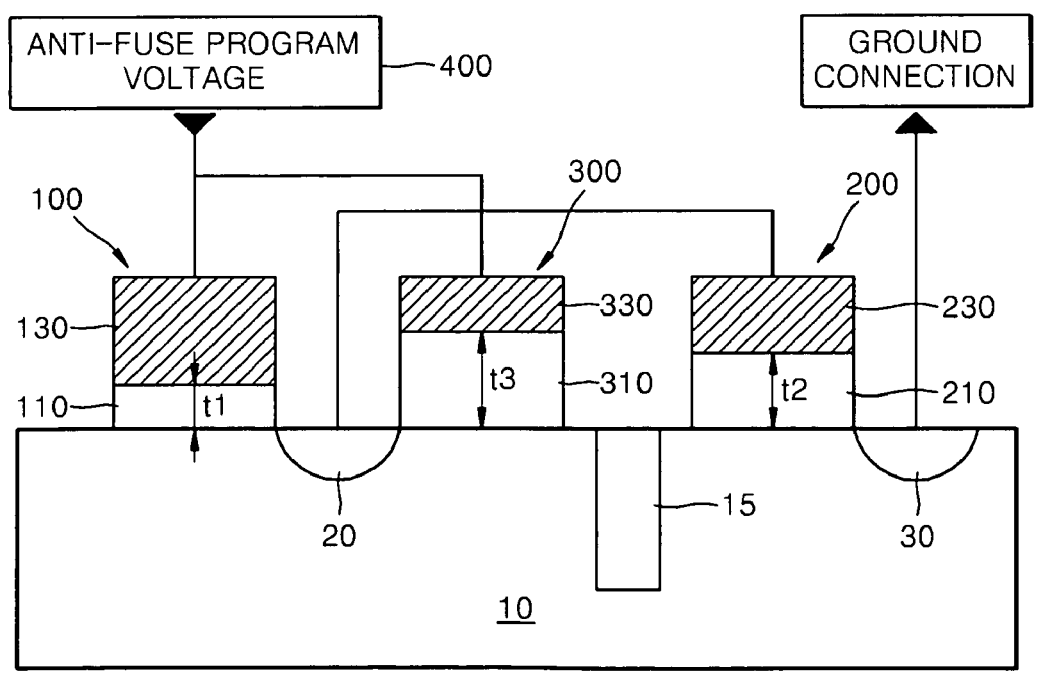

FIG. 2 is a diagram illustrating an equivalent circuit of the structure of a multi-level anti-fuse according to example embodiments. FIG. 3 is a conceptual diagram of the structure of the multi-level anti-fuse of FIG. 2. In the multi-level anti-fuse of example embodiments, each anti-fuse may have, for example, a MOS capacitor structure, as will later be described. However, the anti-fuses may be configured in parallel and in series, and thus, in terms of operation thereof, each anti-fuse acts as a resistor before the anti-fuse breakdown. Therefore, the anti-fuses may be indicated by a resistance symbol in FIG. 2.

The multi-level anti-fuse of example embodiments may include at least three anti-fuses (for example, 100:Z1, 200:Z2, and 300:Z3) each including a dielectric layer having a thickness different from one another, and formed in parallel and in series. The at least three anti-fuses may include a plurality of anti-fuses connected to each other in parallel and at least one anti-fuse connected to the parallel connection structure in series. In this regard, the resistance of the connected in parallel anti-fuses may be smaller than the resistance of the serially connected anti-fuses, and the dielectric layers of the anti-fuses connected in parallel may have different thicknesses from one another, and thus, the breakdown voltages of the anti-fuses may be different from one another.

A dielectric layer of at least one of the anti-fuses connected in parallel may be thinner than the dielectric layer of the anti-fuse connected in series. Thus, the anti-fuse including the dielectric layer having the first thickness may have a lower breakdown voltage than that of the anti-fuse including the dielectric layer having the second thickness. The dielectric layers of the rest of the anti-fuses connected in parallel may be thicker than the first thickness and may have thicknesses different from the second thickness.

Referring to FIGS. 2 and 3, the multi-level anti-fuse according to example embodiments may include a first anti-fuse 100 including a dielectric layer 110 having a first thickness t1, a second anti-fuse 200 including a dielectric layer 210 having a second thickness t2, and a third anti-fuse 300 including a dielectric layer 310 having a third thickness t3. The first thickness t1 may be smaller than the second and third thicknesses t2 and t3. The third thickness t3 may be larger or smaller than the second thickness t2. For example, the first through third anti-fuses 100, 200 and 300 may be formed to satisfy the relationship: the first thickness<the second thickness<the third thickness, e.g., t1<t2<t3.

Accordingly, the first anti-fuse 100 may have the lowest breakdown voltage characteristics of the first through third anti-fuses 100, 200 and 300. In addition, the first anti-fuse 100, among the first through third anti-fuses 100, 200 and 300, may have the fastest soft breakdown characteristics. The first anti-fuse 100 may be connected in parallel to one of the second anti-fuse 200 and the third anti-fuse 300, and the remaining one anti-fuse may be connected to the parallel connection structure in series. In FIGS. 2 and 3, the first anti-fuse 100 may be connected to the third anti-fuse 300 in parallel, and the parallel connection structure may be connected to the second anti-fuse 200 in series. In these drawings, the positions of the second anti-fuse 200 and the third anti-fuse 300 may be switched with each other. For example, the first anti-fuse 100 may be connected to the second anti-fuse 200 in parallel, and the parallel connection structure may be connected to the third anti-fuse 300 in series.

Referring to FIG. 3, the first anti-fuse 100 may be formed on a substrate 10, and may include a gate-stacked structure including the dielectric layer 110 and a gate electrode 130. The second anti-fuse 200 may be formed on the substrate 10, and may include a gate-stacked structure including the dielectric layer 210 and a gate electrode 230. The third anti-fuse 300 may be formed on the substrate 10, and may include a gate-stacked structure including the dielectric layer 310 and a gate electrode 330. Referring to FIG. 3, an isolation region 15 may be formed in the substrate 10, between the parallel connection structure and the anti-fuse connected in series to the parallel connection structure, for example, between the third anti-fuse 300 and the second anti-fuse 200.

In addition, a first doped region 20 may be formed in the substrate 10 so that the first anti-fuse 100 and the third anti-fuse 300, e.g., the dielectric layer 110 of the first anti-fuse 100 and the dielectric layer 310 of the third anti-fuse 300, may be electrically connected to form the parallel connection structure of the first and third anti-fuses 100 and 300, and a voltage may be applied between the substrate 10 and the gate electrodes 130 and 330 of the first and third anti-fuses 100 and 300. In addition, a second doped region 30 may be formed in the substrate 10 so that a voltage may be applied between the gate electrode 230 of the second anti-fuse 200 and the substrate 10. The first or second doped region 20 or 30 may be an n+ region heavily doped with an n-type impurity or a p+ region heavily doped with a p-type impurity. The first doped region 20 may be partially overlapped with one end of a base of each of the dielectric layers 110 and 310. The second doped region 30 may be partially overlapped with one end of a base of the dielectric layer 210.

A contact layer (not shown) may be further formed on a surface of the first or second doped region 20 or 30 in order to decrease contact resistance. The contact layer may be formed of, for example, silicide. As illustrated in FIG. 3, the gate electrodes 130 and 330 of the first and third anti-fuses 100 and 300 may be electrically connected to a positive terminal of an electrical source 400, the first doped region 20 and the gate electrode 230 of the second anti-fuse 200 may be electrically connected to each other, and the second doped region 30 may be grounded. Alternatively, as opposite to the illustration shown in FIG. 3, the positive terminal of the electrical source 400 may be electrically connected to the second doped region 30 of the substrate 10, and the gate electrodes 130 and 330 of the first and third anti-fuses 100 and 300 may be grounded.

The parallel connection structure of the first and third anti-fuses 100 and 300, the second anti-fuse 200 connected thereto in series, and the electrical source 400 may be connected so as to configure a closed circuit, and as a result, the circuit illustrated in FIG. 2 may be obtained. The substrate 10 may be a p-substrate lowly doped with a p-type impurity or an n-substrate lowly doped with an n-type impurity. The substrate 10 may be an n-type or p-type bulk silicon substrate or a silicon-on-insulator (SOI) substrate.

The dielectric layers 110, 210 and 310 of the first through third anti-fuses 100, 200 and 300 may be a layer formed of a material that may have breakdown properties when a voltage greater than a critical voltage may be applied. For example, the dielectric layers 110, 210 and 310 of the first through third anti-fuses 100, 200 and 300 may be a layer formed of a material having irreversible resistance variation properties, e.g., breakdown properties. For example, the dielectric layers 110, 210 and 310 may be a layer formed of a material, e.g., silicon oxide, aluminum oxide, or silicon nitride, which may have a breakdown when the voltage greater than a critical voltage may be applied. These dielectric layers 110, 210 and 310 may be an example of an anti-fuse means that may be irreversibly changed from a higher resistance state to a lower resistance state. The gate electrodes 130, 230 and 330 of the first through third anti-fuses 100, 200 and 300 may have a single-layered or multi-layered structure, and may include at least one of a conductive semiconductor layer and a metal layer. For example, the gate electrodes 130, 230 and 330 may include a polysilicon layer and a silicide layer that may be sequentially formed in this order on the dielectric layers 110, 210 and 310, or may have a single-layered or multi-layered metal structure.

When the first through third anti-fuses 100, 200 and 300 includes only the dielectric layers 110, 210 and 310 and the gate electrodes 130, 230 and 330 which are stacked on the substrate 10, the first through third anti-fuses 100, 200 and 300 may have the MOS-capacitor structures. In the first anti-fuse 100, when the voltage is greater than a critical voltage applied between the gate electrode 130 and the substrate 10, the breakdown of the dielectric layer 110 may occur. In the second anti-fuse 200, when the voltage is greater than a critical voltage applied between the gate electrode 230 and the substrate 10, the breakdown of the dielectric layer 210 may occur. In the third anti-fuse 300, when the voltage is greater than a critical voltage applied between the gate electrode 330 and the substrate 10, the breakdown of the dielectric layer 310 may occur.

As described above, the thicknesses of the dielectric layers 110, 210 and 310 may be different from one another, and thus each of the dielectric layers 110, 210 and 310 of the first through third anti-fuses 100, 200 and 300 may have a programming voltage, which causes a breakdown, with a different magnitude. Before the breakdown of a dielectric layer, an anti-fuse may be in a state before programming, and, after the breakdown of the dielectric layer, the anti-fuse may be in a state after programming.

Figure 4:
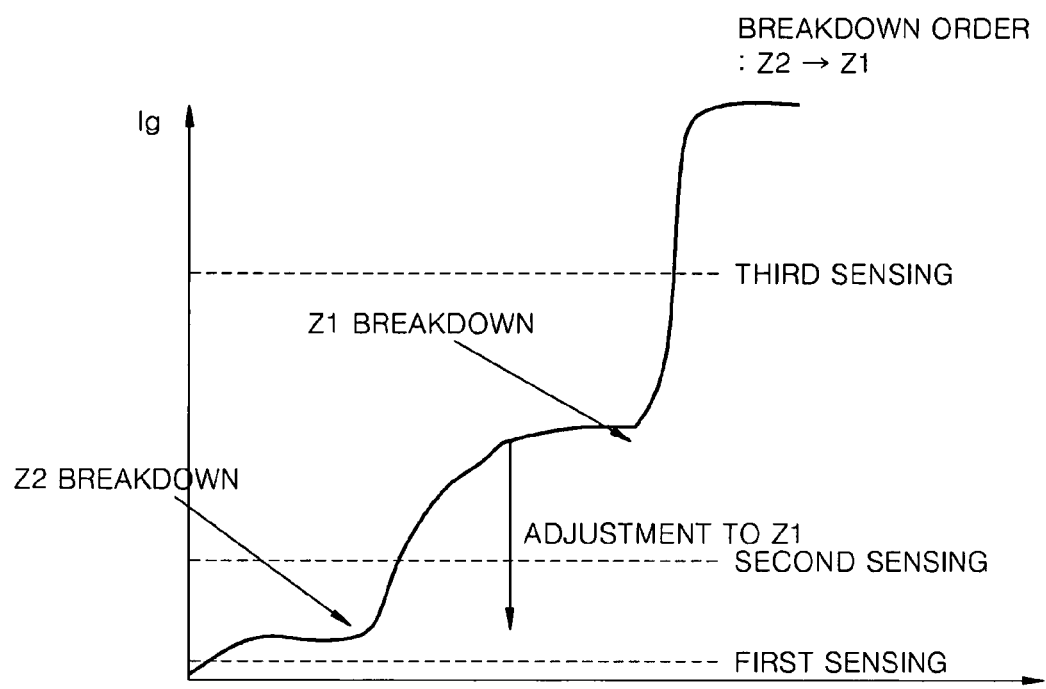
Figure 5:
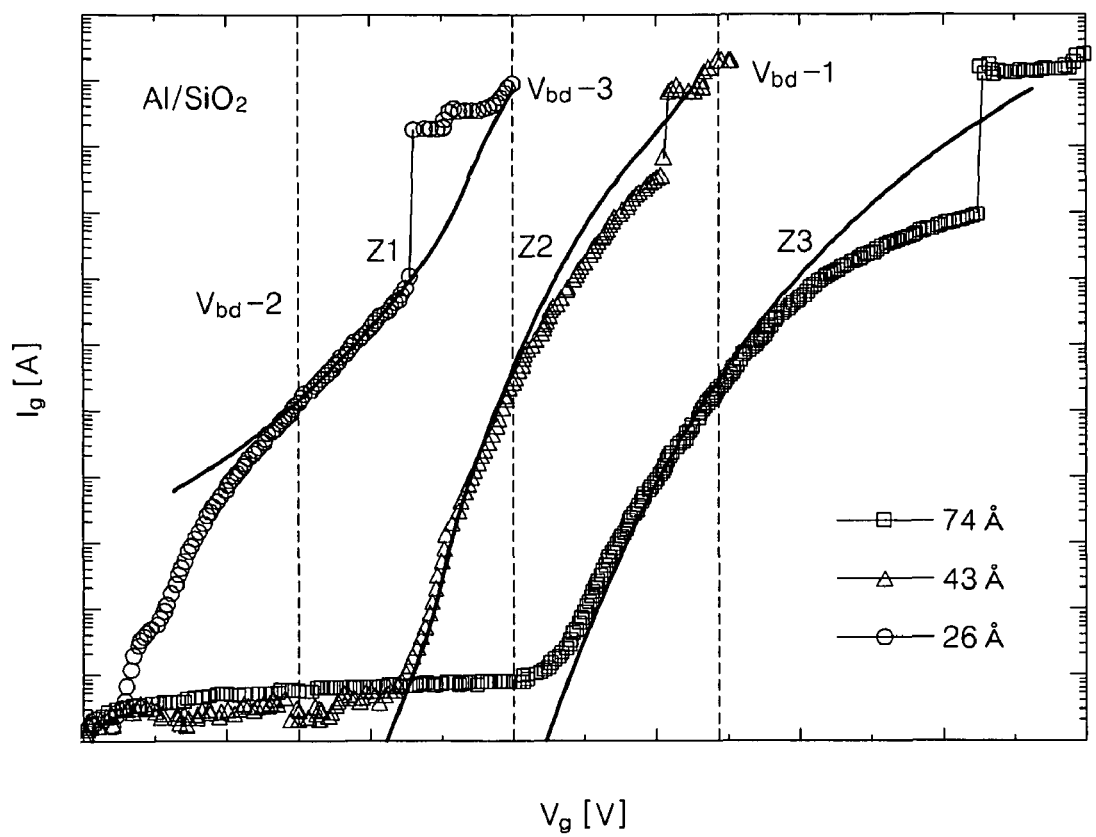

FIG. 4 is a diagram illustrating an operation of a multi-level anti-fuse according to example embodiments. FIG. 5 is a graph showing a bias section for the operation of the multi-level anti-fuse of FIG. 4. An operation voltage may vary according to dielectric properties, for example, the thickness of a dielectric layer of an anti-fuse and/or the dielectric constant thereof. Referring to FIGS. 2, 4 and 5, when a predetermined or given voltage from the electrical source 400 is applied to the multi-level anti-fuse according to example embodiments, the resistance of the parallel connection structure of the first and the third anti-fuses 100 and 300 may be smaller than the resistance of the second anti-fuse 200. Thus, most of a first voltage $V_{bd}$-1 may be applied to the second anti-fuse 200, and the breakdown of the second anti-fuse 200 (Z2) may occur (refer to a portion of "Z2 breakdown" in FIG. 4). A section before the breakdown of the second anti-fuse 200 may be a first sensing level section.

When the breakdown of the second anti-fuse 200 occurs, the second anti-fuse 200 may be in a short circuit state, and thus, a voltage may be applied in parallel to the first and third anti-fuses 100 and 300. The breakdown voltage of the first anti-fuse 100 may be lower than the breakdown voltage of the third anti-fuse 300. Thus, when a second voltage $V_{bd}$-2 is applied in parallel to the first and the third anti-fuses 100 and 300 and the applied second voltage $V_{bd}$-2 does not affect the third anti-fuse 300, a soft breakdown may occur only in the first anti-fuse 100, and as a result, a first rising of a leakage current may occur. A time where the first rising occurs may be a second sensing level section. A sensing margin may be determined by adjusting the thickness of the dielectric layer 110 of the first anti-fuse 100. For example, the thinner the dielectric layer 110 of the first anti-fuse 100, the lower a voltage where the first rising may start. Thus, the thinner the dielectric layer 110 of the first anti-fuse 100, the greater a first sensing margin may be.

A third voltage $V_{bd}$-3, which causes a hard breakdown of the first anti-fuse 100, may be applied in parallel to the first and the third anti-fuses 100 and 300 to cause the hard breakdown of the first anti-fuse 100 (Z1). As a result, a third sensing level section may be obtained. The first through third sensing level sections may be detected by a sensing unit 500. A signal detected by the sensing unit 500, corresponding to the first sensing level section in which the breakdown of the first through third anti-fuses 100, 200 and 300 does not occur, a signal detected by the sensing unit 500, corresponding to the second sensing level section in which the breakdown of the second anti-fuse 200 occurs and the first rising of the leakage current occurs, and a signal detected by the sensing unit 500, corresponding to the third sensing level section that is a section after the hard breakdown of the first anti-fuse 300 occurs, may be different from one another. Accordingly, knowing which state the multi-level anti-fuse may be based on the signals detected by the sensing unit 500 may be possible.

An operation of a multi-level program of the multi-level anti-fuse according to example embodiments may include sensing the multi-level anti-fuse by applying the first voltage $V_{bd}$-1 thereto in a section before the breakdown of the anti-fuse connected to the parallel connection structure in series, for example, the second anti-fuse 200, generating the breakdown of the second anti-fuse 200 connected to the parallel connection structure in series, sensing the multi-level anti-fuse such that the second voltage $V_{bd}$-2 may be applied to the multi-level anti-fuse in the state that the breakdown of the second anti-fuse 200 occurs to cause the soft breakdown of the anti-fuse having the smallest breakdown voltage from among the anti-fuses of the parallel connection structure, for example, the first anti-fuse 100, resulting in the first rising of the leakage current, and sensing the multi-level anti-fuse such that the third voltage $V_{bd}$-3 may be applied thereto to cause the hard breakdown of the first anti-fuse 100 having the smallest breakdown voltage from among the anti-fuses of the parallel connection structure, and may cause the soft breakdown of the anti-fuse having the second smallest breakdown voltage from among the anti-fuses of the parallel connection structure, for example, the third anti-fuse 300, resulting in the second rising of the leakage current.

The multi-level anti-fuse according to example embodiments may include a single sensing unit per a plurality of anti-fuses, and thus, the size of a circuit of the multi-level anti-fuse may be decreased. As a result, a total chip size may be decreased. In addition, the multi-level anti-fuse according to example embodiments may have a plurality of sensing levels, and thus, applying program voltages step by step may operate a multi-level program. Therefore, the multi-level anti-fuse according to example embodiments may be used as a one-time programmable (OTP) memory.

When the multi-level anti-fuse of example embodiments, which includes two anti-fuses connected in parallel and an anti-fuse connected thereto in series, is applied in an OTP memory device, a state before a program operation (for example, any one of the anti-fuses is not broken down), for example, a "11" state, and three program states after the program operation, for example, "01", "00", and "10" states, may be obtained.

Although the multi-level anti-fuse of example embodiments, which may include two anti-fuses connected in parallel and an anti-fuse connected thereto in series, has been described above, example embodiments are not limited thereto. For example, a plurality of anti-fuses in which breakdown occurs with respect to voltages different from one another may be connected to the parallel connection structure in series. A program may be operated in such an order that the plurality of anti-fuses connected to the parallel connection structure in series sequentially breakdown, and the anti-fuse having the lowest breakdown voltage in the parallel connection structure may breakdown. When the parallel connection structure includes at least three anti-fuses, the breakdown of the at least three anti-fuses may sequentially occur in the order of the lowest breakdown voltage.

While example embodiments have been particularly shown and described with reference to example embodiments thereof, it will be understood by one of ordinary skill in the art that various changes in form and details may be made therein without departing from the spirit and scope of example embodiments as defined by the following claims.

What is claimed is:

1. A multi-level anti-fuse comprising:
   at least three anti-fuses including a plurality of anti-fuses connected in parallel constituting a parallel connection structure; and
   at least one anti-fuse connected to the parallel connection structure in series,
   wherein the parallel connection structure has a smaller resistance than the resistance of the anti-fuse connected in series, and
   the plurality of anti-fuses connected in parallel includes dielectric layers having different thicknesses from one another, and the breakdown voltages of each dielectric layer are different from one another.

2. The multi-level anti-fuse of claim 1, wherein the dielectric layer of at least one of the plurality of anti-fuses connected in parallel has a first thickness that is thinner than a second thickness of the dielectric layer of the anti-fuse connected in series, and
   the anti-fuse including the dielectric layer having the first thickness has a lower breakdown voltage than the breakdown voltage of the anti-fuse including the dielectric layer having the second thickness.

3. The multi-level anti-fuse of claim 2, wherein the thickness of the dielectric layer of at least one of the plurality of anti-fuses connected in parallel is larger than the first thickness and is different from the second thickness.

4. The multi-level anti-fuse of claim 2, wherein each of the plurality of anti-fuses connected in parallel and the at least one anti-fuse connected in series to the plurality of anti-fuses connected in parallel includes a dielectric layer on a substrate and a gate electrode on the dielectric layer.

5. The multi-level anti-fuse of claim 1, wherein the at least three anti-fuses include:
   a first anti-fuse including a dielectric layer having a first thickness and a first gate electrode on the dielectric layer;
   a second anti-fuse including a dielectric layer having a second thickness and a second gate electrode on the dielectric layer; and
   a third anti-fuse including a dielectric layer having a third thickness and a third gate electrode on the dielectric layer,
   wherein the first thickness is smaller than the second and third thicknesses, the first and third anti-fuses are connected in parallel, and the second anti-fuse is connected to the parallel connection structure in series.

6. The multi-level anti-fuse of claim 5, wherein the third thickness is larger or smaller than the second thickness.

7. The multi-level anti-fuse of claim 1, wherein the dielectric layer is a layer formed of a material that has breakdown properties when a voltage greater than a critical voltage is applied.

8. The multi-level anti-fuse of claim 7, wherein the dielectric layer is an oxide layer that can have a breakdown when a voltage greater than a critical voltage is applied.

9. A method of operating the multi-level anti-fuse comprising:
   providing at least three anti-fuses including a plurality of anti-fuses connected in parallel constituting a parallel connection structure, and at least one anti-fuse connected to the parallel connection structure in series, wherein the parallel connection structure has a smaller resistance than the resistance of the anti-fuse connected in series, and the plurality of anti-fuses connected in parallel have dielectric layers having different thicknesses from one another, and the breakdown voltages of each dielectric layer are different from one another;
   sensing the multi-level anti-fuse in a section before a breakdown of the anti-fuse connected to the parallel connection structure in series by applying a first voltage to the multi-level anti-fuse;
   causing the anti-fuse connected to the parallel connection structure in series to have a breakdown;
   sensing the multi-level anti-fuse by applying a second voltage to the multi-level anti-fuse in a state where a breakdown of the anti-fuse connected to the parallel connection structure in series occurs to cause the soft breakdown of the anti-fuse having the smallest breakdown voltage from among the plurality of anti-fuses of the parallel connection structure, resulting in a rise in the leakage current; and
   sensing the multi-level anti-fuse by applying a third voltage to the multi-level anti-fuse to cause the hard breakdown of the anti-fuse having the smallest breakdown voltage from among the plurality of anti-fuses of the parallel connection structure and cause the soft breakdown of the anti-fuse having the second smallest breakdown voltage from among the plurality of anti-fuses of the parallel connection structure, resulting in a second rising of a leakage current.

10. The method of claim 9, wherein, in the multi-level anti-fuse, a dielectric layer of at least one of the anti-fuses connected in parallel has a first thickness that is thinner than a second thickness of a dielectric layer of the anti-fuse connected in series to the anti-fuses connected in parallel, and
   the anti-fuse including the dielectric layer having the first thickness has a lower breakdown voltage than the breakdown voltage of the anti-fuse including the dielectric layer having the second thickness.

11. The method of claim 10, wherein the thickness of the dielectric layer of at least one of the plurality of anti-fuses connected in parallel is larger than the first thickness and different from the second thickness.

12. The method of claim 10, wherein each of the plurality of anti-fuses connected in parallel and the at least one anti-fuse connected in series to the plurality of anti-fuses connected in parallel includes a dielectric layer on a substrate and a gate electrode on the dielectric layer.

13. The method of claim 9, wherein the at least three anti-fuses include:
 a first anti-fuse including a dielectric layer having a first thickness and a first gate electrode on the dielectric layer;
 a second anti-fuse including a dielectric layer having a second thickness and a second gate electrode on the dielectric layer; and
 a third anti-fuse including a dielectric layer having a third thickness and a third gate electrode on the dielectric layer,
 wherein the first thickness is smaller than the second and third thicknesses, the first and third anti-fuses are connected in parallel, and the second anti-fuse is connected to the parallel connection structure in series.

14. The method of claim 13, wherein, in the multi-level anti-fuse, the third thickness is larger or smaller than the second thickness.

15. A method of fabricating a multi-level anti-fuse comprising:
 connecting at least three anti-fuses including a plurality of anti-fuses in parallel to constitute a parallel connection structure; and
 connecting at least one anti-fuse to the parallel connection structure in series,
 wherein the parallel connection structure has a smaller resistance than the resistance of the anti-fuse connected in series, and
 the plurality of anti-fuses connected in parallel includes dielectric layers having different thicknesses from one another, and the breakdown voltages of each dielectric layer are different from one another.

16. The method of claim 15, wherein the dielectric layer of at least one of the plurality of anti-fuses connected in parallel has a first thickness that is thinner than a second thickness of the dielectric layer of the anti-fuse connected in series, and
 the anti-fuse including the dielectric layer having the first thickness has a lower breakdown voltage than the breakdown voltage of the anti-fuse including the dielectric layer having the second thickness.

17. The method of claim 16, wherein the thickness of the dielectric layer of at least one of the plurality of anti-fuses connected in parallel is larger than the first thickness and is different from the second thickness.

18. The method of claim 16, wherein connecting each of the plurality of anti-fuses in parallel and connecting the at least one anti-fuse in series to the plurality of anti-fuses connected in parallel includes:
 forming a dielectric layer on a substrate; and
 forming a gate electrode on the dielectric layer.

19. The method of claim 15, wherein the at least three anti-fuses include:
 a first anti-fuse including a dielectric layer having a first thickness and a first gate electrode on the dielectric layer;
 a second anti-fuse including a dielectric layer having a second thickness and a second gate electrode on the dielectric layer; and
 a third anti-fuse including a dielectric layer having a third thickness and a third gate electrode on the dielectric layer,
 wherein the first thickness is smaller than the second and third thicknesses, the first and third anti-fuses are connected in parallel, and the second anti-fuse is connected to the parallel connection structure in series.

20. The method of claim 19, wherein the third thickness is larger or smaller than the second thickness.

* * * * *